United States Patent
Kim et al.

(10) Patent No.: US 10,157,823 B2
(45) Date of Patent: Dec. 18, 2018

(54) HIGH DENSITY FAN OUT PACKAGE STRUCTURE

(71) Applicant: QUALCOMM Incorporated, San Diego, CA (US)

(72) Inventors: Dong Wook Kim, San Diego, CA (US); Hong Bok We, San Diego, CA (US); Jae Sik Lee, San Diego, CA (US); Shiqun Gu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/693,820

(22) Filed: Apr. 22, 2015

(65) Prior Publication Data

US 2016/0126173 A1    May 5, 2016

Related U.S. Application Data

(60) Provisional application No. 62/073,804, filed on Oct. 31, 2014.

(51) Int. Cl.
*H01L 23/48* (2006.01)
*H01L 29/40* (2006.01)
(Continued)

(52) U.S. Cl.
CPC ...... *H01L 23/49816* (2013.01); *H01L 21/486* (2013.01); *H01L 21/4853* (2013.01);
(Continued)

(58) Field of Classification Search
CPC ..... H01L 2224/0401; H01L 2224/1112; H01L 2224/11502; H01L 2224/11526;
(Continued)

(56) References Cited

U.S. PATENT DOCUMENTS 6,706,625 B1 * 3/2004 Sudijono ........... H01L 21/76849
438/619
8,551,860 B2 10/2013 Bang et al.
(Continued)

OTHER PUBLICATIONS

International Search Report and Written Opinion—PCT/US2015/048514—ISA/EPO—dated Nov. 10, 2015.

*Primary Examiner* — Kimberly Rizkallah
*Assistant Examiner* — Dilinh Nguyen
(74) *Attorney, Agent, or Firm* — Qualcomm Incorporated/Seyfarth Shaw LLP

(57) ABSTRACT

A high density fan out package structure may include a contact layer. The contact layer includes a conductive interconnect layer having a first surface facing an active die and a second surface facing a redistribution layer. The high density fan out package structure has a barrier layer on the first surface of the conductive interconnect layer. The high density fan out package structure may also include the redistribution layer, which has conductive routing layers. The conductive routing layers may be configured to couple a first conductive interconnect to the conductive interconnect layer. The high density fan out package structure may further include a first via coupled to the barrier liner and configured to couple with a second conductive interconnect to the active die.

17 Claims, 14 Drawing Sheets

(51) Int. Cl.
*H01L 23/498* (2006.01)
*H01L 23/00* (2006.01)
*H01L 21/48* (2006.01)
*H01L 21/683* (2006.01)

(52) U.S. Cl.
CPC ........ *H01L 21/6835* (2013.01); *H01L 23/498* (2013.01); *H01L 23/49827* (2013.01); *H01L 23/49838* (2013.01); *H01L 23/49866* (2013.01); *H01L 24/03* (2013.01); *H01L 24/09* (2013.01); *H01L 24/81* (2013.01); *H01L 23/49811* (2013.01); *H01L 23/49822* (2013.01); *H01L 2221/68345* (2013.01); *H01L 2221/68359* (2013.01); *H01L 2224/0401* (2013.01); *H01L 2224/08238* (2013.01); *H01L 2224/73204* (2013.01); *H01L 2224/81005* (2013.01); *H01L 2224/81192* (2013.01); *H01L 2224/83005* (2013.01); *H01L 2924/01073* (2013.01); *H01L 2924/15311* (2013.01); *H01L 2924/15321* (2013.01)

(58) Field of Classification Search
CPC . H01L 2224/13006; H01L 2224/13007; H01L 2225/06513; H01L 2225/06517; H01L 23/448; H01L 2224/16055; H01L 21/4885; H01L 2221/68359; H01L 2224/81192; H01L 2224/08238; H01L 2924/15321; H01L 23/49816; H01L 238/498; H01L 21/4853; H01L 23/49866; H01L 21/486; H01L 24/09; H01L 23/49838; H01L 21/6835; H01L 24/81; H01L 23/49827; H01L 24/03; H01L 23/49822; H01L 23/49811; H01L 2924/01073; H01L 2221/68345; H01L 2224/1302; H01L 2224/141; H01L 2224/161; H01L 2224/171; H01L 2224/211; H01L 2224/2902; H01L 2224/301; H01L 2224/321; H01L 2224/4502; H01L 2224/481; H01L 2224/491
USPC .................... 257/738, 778, 779, 780, 786
See application file for complete search history.

(56) References Cited

U.S. PATENT DOCUMENTS

| 8,552,556 B1 | 10/2013 | Kim et al. | |
|---|---|---|---|
| 2004/0241979 A1* | 12/2004 | Faust | H01L 21/31116 438/628 |
| 2005/0037601 A1 | 2/2005 | Hsu et al. | |
| 2010/0140805 A1* | 6/2010 | Chang | H01L 21/6835 257/773 |
| 2011/0254156 A1* | 10/2011 | Lin | H01L 21/566 257/737 |
| 2011/0266667 A1 | 11/2011 | Wu et al. | |
| 2012/0282767 A1 | 11/2012 | Jin et al. | |
| 2013/0341784 A1* | 12/2013 | Lin | H01L 21/56 257/737 |
| 2014/0048952 A1* | 2/2014 | Lee | H01L 23/5384 257/774 |
| 2014/0061924 A1 | 3/2014 | Chen et al. | |
| 2014/0252572 A1 | 9/2014 | Hou et al. | |

\* cited by examiner

HIGH DENSITY FAN OUT PACKAGE STRUCTURE

CROSS-REFERENCE TO RELATED APPLICATION

This application claims the benefit under 35 U.S.C. § 119(e) to U.S. Provisional Patent Application No. 62/073,804, entitled "HIGH DENSITY FAN OUT PACKAGE STRUCTURE," filed on Oct. 31, 2014, the disclosure of which is expressly incorporated by reference herein in its entirety.

BACKGROUND

Field

Aspects of the present disclosure relate to semiconductor devices, and more particularly to high density fan out (HDFO) techniques for fabrication of a high density fan out structure.

Background

The process flow for semiconductor fabrication of integrated circuits (ICs) may include front-end-of-line (FEOL), middle of-line (MOL), and back-end-of-line (BEOL) processes. The front-end-of-line processes may include wafer preparation, isolation, well formation, gate patterning, spacer, extension and source/drain implantation, silicide formation, and dual stress liner formation. The middle-of-line process may include gate contact formation. Middle-of-line layers may include, but are not limited to, middle-of-line contacts, vias or other layers within close proximity to the semiconductor device transistors or other like active devices. The back-end-of-line processes may include a series of wafer processing steps for interconnecting the semiconductor devices created during the front-end-of-line and middle-of-line processes. Successful fabrication of modern semiconductor chip products involves an interplay between the materials and the processes employed.

An interposer is a die-mounting technology in which the interposer serves as a base upon which the semiconductor dies of a system on chip (SoC) are mounted. An interposer is an example of a fan out wafer level package structure. The interposer may include wiring layers of conductive traces and conductive vias for routing electrical connections between the semiconductor dies (e.g., memory modules and processors) and a system board. The interposer may include a redistribution layer (RDL) that provides a connection pattern of bond pads on the active surface of a semiconductor device (e.g., a die or chip) to a redistributed connection pattern that is more suitable for connection to the system board. In most applications, the interposer does not include active devices such as diodes and transistors.

Fabrication of a wafer level package structures may include attachment of a semiconductor device (e.g., a die or chip) to the wafer level package structure according to a chip first attach process prior to forming the redistribution layer. The chip first attach process, however, may render the semiconductor device defective because of stress on the semiconductor device during the formation of the redistribution layer and/or because of defects associated with the redistribution layer.

SUMMARY

A high density fan out package structure may include a contact layer. The contact layer includes a conductive interconnect layer having a first surface facing an active die and a second surface facing a redistribution layer. The high density fan out package structure has a barrier layer on the first surface of the conductive interconnect layer. The high density fan out package structure may also include the redistribution layer having conductive routing layers. The conductive routing layers may be configured to couple a first conductive interconnect to the conductive interconnect layer. The high density fan out package structure may further include a first via coupled to the barrier liner and configured to couple with a second conductive interconnect to the active die.

A method of fabricating a high density fan out package structure may include fabricating a contact layer on a carrier substrate. The contact layer may include a conductive interconnect layer having a barrier liner on a first surface. The method may also include fabricating a redistribution layer (RDL). The redistribution layer may include conductive routing layers configured to couple a first conductive interconnect to the conductive interconnect layer. The method may further include depositing a conductive material within an opening in the contact layer to form a first via disposed on the barrier liner after removing the carrier substrate. The method may also include attaching an active die to the via using a second conductive interconnect. The barrier liner on the first surface of the conductive interconnect layer may face the active die.

A high density fan out package structure may include a contact layer. The contact layer includes a conductive interconnect layer having a first surface facing an active die. The high density fan out package structure has a barrier layer on the first surface of the conductive interconnect layer. The high density fan out package structure may also include means for coupling a first conductive interconnect to the conductive interconnect layer. The second surface of the conductive interconnect layer may face the coupling means. The high density fan out package structure may further include a first via coupled to the barrier liner and configured to couple with a second conductive interconnect to the active die.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
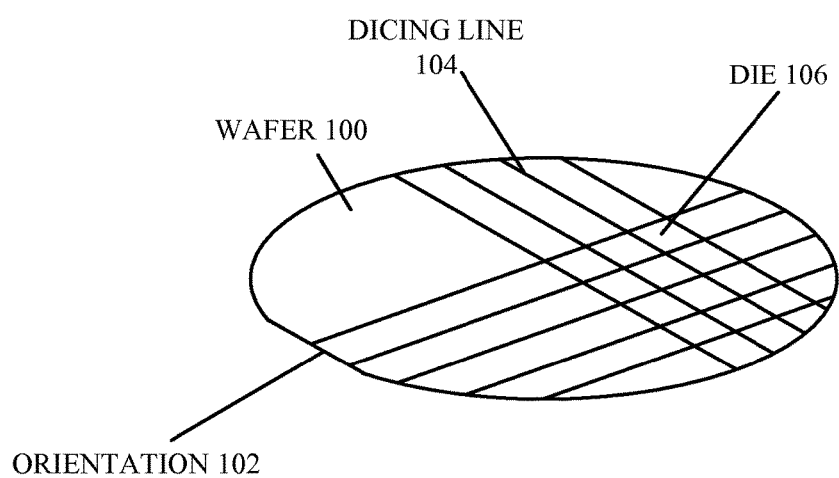
FIG. 1 illustrates a perspective view of a semiconductor wafer in an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Some described implementations relate to wafer level package structures, such as interposer technology. An interposer generally serves as an intermediate layer that can be used for direct electrical interconnection between one component or substrate and a second component or substrate with the interposer positioned in between. For example, an interposer may have a pad configuration on one side that can be aligned with corresponding pads on a first component (e.g., a die), and a different pad configuration on a second side that corresponds to pads on a second component (e.g., a package substrate, system board, etc.) Interposers are widely used for integrating multiple chips on a single package. In addition, interposer substrates can be composed of glass and quartz, organic, or other like material and normally contain a few interconnect layers.

Fabrication of wafer level package structures, such as interposers, may include the formation of a redistribution layer (RDL). The redistribution layer may enable expansion of a connection pattern of bond pads on the active surface of an active device (e.g., a die or chip) to a redistributed connection pattern that is more suitable for connection to a substrate (e.g., system board, package substrate, printed circuit board, etc.). Conventional fabrication techniques include attaching the active device prior to forming a redistribution layer according to a chip first attach process. The chip first attach process, however, assumes that no defects are associated with the redistribution layer. Unfortunately, defects in the redistribution layer may lead to loss of the active device. In addition, stress on the active device during the formation of the redistribution layer may render the active device defective.

Various aspects of the disclosure provide techniques for fabrication of a high density fan out (HDFO) package structure. The process flow for semiconductor fabrication of the HDFO package structure may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to the substrate of a wafer that is not diced. Similarly, the terms chip and die may be used interchangeably unless such interchanging would tax credulity.

As described herein, the middle-of-line interconnect layers may refer to the conductive interconnects for connecting a first conductive layer (e.g., metal one (M1)) of the back-end-of-line to the oxide diffusion (OD) layer of an integrated circuit and also for connecting M1 to the active devices of the integrated circuit. The middle-of-line interconnect layers for connecting M1 to the OD layer of an integrated circuit may be referred to as "MD1" and "MD2." The middle-of-line interconnect layer for connecting M1 to the poly gates of an integrated circuit may be referred to as "MP." A middle-of-line zero via (V0) may connect M1 to the middle-of-line interconnect layers.

A HDFO package structure, according to aspects of the present disclosure, includes multiple active die or a single chip structure. HDFO package structure may be fabricated according to a chip last attach process. The chip last attach process includes attaching an active die to the HDFO package structure after a redistribution layer is formed. For example, the redistribution layer may be verified through testing before the active die is attached to avoid attachment to a defective redistribution layer.

In one aspect of the disclosure, the HDFO package structure includes a contact layer that includes a conductive interconnect layer. The conductive interconnect layer may include a first surface facing an active die and a second surface facing a redistribution layer. A first conductive interconnect (e.g., ball grid array (BGA)) may couple the HDFO package structure to an external device. A conductive liner may be disposed on the first surface of the conductive interconnect layer. The conductive liner may be a barrier or seed liner of tantalum. The barrier liner may provide protection for the conductive interconnect layer during the formation (e.g., electroplating) of the interconnects to the active die.

A redistribution layer (RDL) is coupled to the conductive interconnect layer of the contact layer. The redistribution layer may be a fan out routing layer. The redistribution layer includes conductive routing layers configured to couple a first conductive interconnect to the conductive interconnect layer. As noted, the redistribution layer is formed before attaching the active die to avoid damaging the active die during formation of the redistribution layer. The redistribution layer can be a backside redistribution layer (BRDL) that is formed on a full thickness wafer. Implementing the HDFO package structure on the backside redistribution layer improves yield of the active die and reduces warpage of the HDFO package structure.

A via may be coupled to the barrier liner to interconnect the second conductive interconnect of the active die. The conductive material may include one or more conductive interconnects. For example, the second conductive material may include an under bump conductive interconnect, a solder material and/or a conductive pillar. The under bump conductive interconnect may be disposed in an opening within the conductive layer that exposes a surface of the barrier liner. The conductive pillar may be coupled to a contact pad of the die. The solder material be between the under bump conductive interconnect and the conductive pillar. The under bump conductive interconnect and the conductive pillar may be copper.

FIG. 1 illustrates a perspective view of a semiconductor wafer in an aspect of the present disclosure. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystallizes onto the seed crystal in the orientation of the crystal.

The wafer 100 may be a compound material, such as gallium arsenide (GaAs) or gallium nitride (GaN), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

The Miller Indices form a notation system of the crystallographic planes in crystal lattices. The lattice planes may be indicated by three integers h, k, and l, which are the Miller indices for a plane (hkl) in the crystal. Each index denotes a plane orthogonal to a direction (h, k, l) in the basis of the reciprocal lattice vectors. The integers are usually written in lowest terms (e.g., their greatest common divisor should be 1). Miller index 100 represents a plane orthogonal to direction h; index 010 represents a plane orthogonal to direction k, and index 001 represents a plane orthogonal to f. For some crystals, negative numbers are used (written as a bar over the index number) and for some crystals, such as gallium nitride, more than three numbers may be employed to adequately describe the different crystallographic planes.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
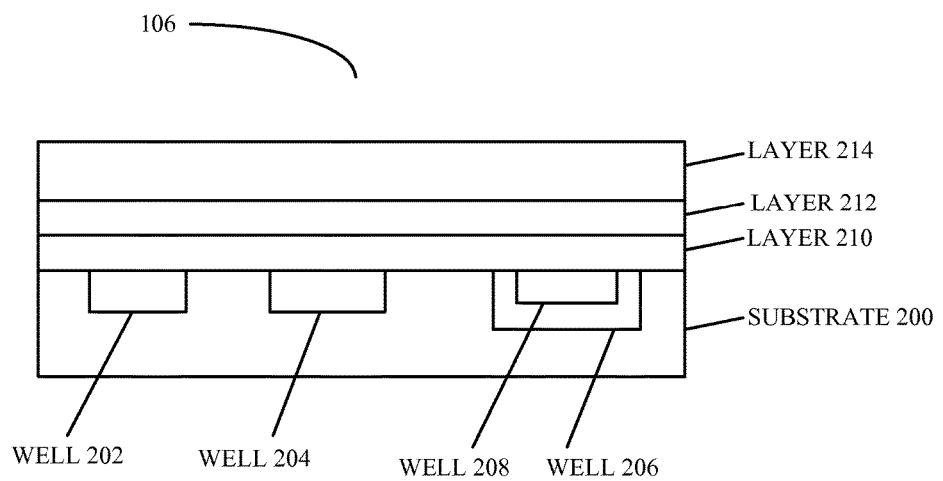
FIG. 2 illustrates a cross-sectional view of a die in accordance with an aspect of the present disclosure.

FIG. 2 illustrates a cross-sectional view of a die 106 in accordance with an aspect of the present disclosure. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

Within a substrate 200 (e.g., a semiconductor substrate), there may be wells 202 and 204, which may be the source and/or drain of a field-effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

Figure 3:
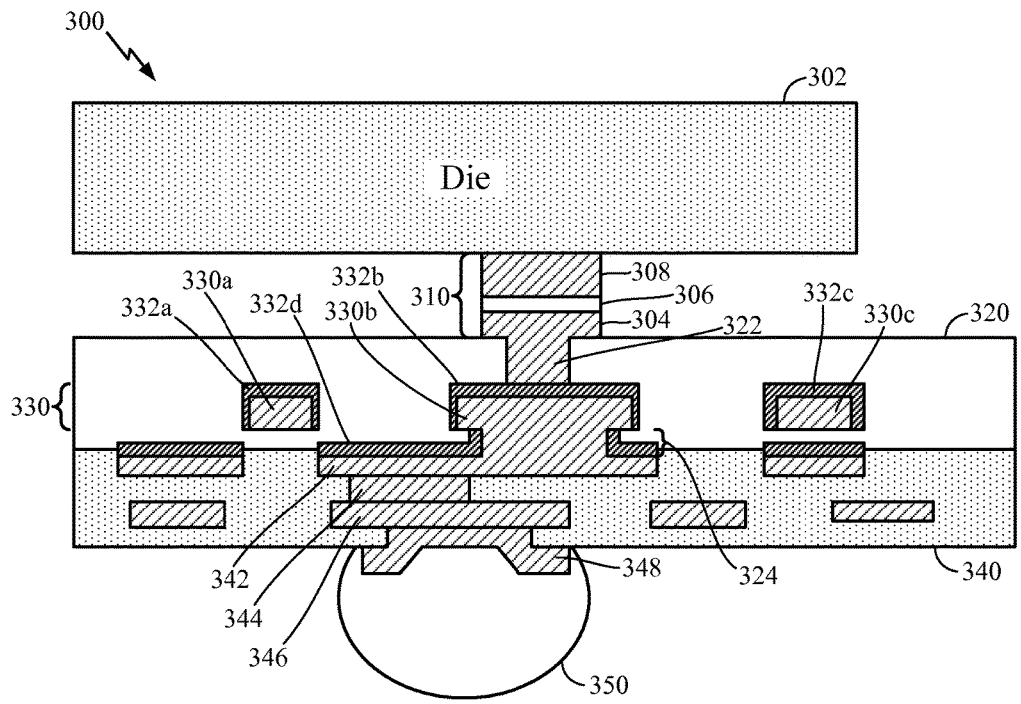
FIG. 3 illustrates a high density fan out package structure according to one aspect of the present disclosure.

FIG. 3 illustrate a high density fan out (HDFO) package structure 300 according to one aspect of the present disclosure. The HDFO package structure 300 may couple a first conductive interconnect 350 (e.g., back-side) to an active die 302 through a second conductive interconnect 310 (e.g., front-side). In this arrangement, the second conductive interconnect 310 has a pillar shape and includes a first conductive portion 304 (e.g., a conductive trace or contact pad), a second conductive portion 306 (e.g., a solder material) and a third conductive portion 308 (e.g., a conductive pillar of the active die 302). In another configuration, the second conductive interconnect may be fabricated using a conductive bump (e.g., a solder material). The HDFO package structure 300 also includes a contact layer 320 having a conductive interconnect layer 330 (330a, 330b, 330c) formed between one or more dielectric layers (e.g., nitride). The HDFO package structure 300 also includes a redistribution layer 340 including conductive routing layers (e.g., 342, 344, 346) coupled to the first conductive interconnect 350 through, for example, an under fill interconnect layer 348.

The conductive routing layers (e.g., 342, 344, 346) of the redistribution layer 340 in combination with the conductive interconnect layer 330 (e.g., 330a, 330b, 330c) of the contact layer 320 facilitate communication between the active die 302 and the first conductive interconnect 350 (e.g., a ball grid array (BGA)). For example, the conductive interconnect layer 330 is formed using a first back-end-of-line (BEOL) conductive interconnect layer (e.g., metal one (M1)). The conductive interconnect layer 330 may be surrounded by dielectric layers of the contact layer 320 and coupled to the second conductive interconnect 310 through a first via 322 (e.g., a middle-of-line (MOL) zero via (V0)).

In this arrangement, the conductive interconnect layer 330 (e.g., 330b) is coupled to the redistribution layer 340 through a second via 324 (e.g., a BEOL first via (V1) or a conductive trace) and coupled to the active die 302 through the first via 322. The first via 322 may be formed by a damascene process, an additive etch and fill process, a laser via and fill process or other like process for via formation. The second via 324 may be a conductive routing layer of the redistribution layer 340. The conductive routing layers (e.g., 342, 344, 346) may be formed within a polymer dielectric material of the redistribution layer 340. The conductive interconnect layer 330 and the conductive routing layers (e.g., 342, 344, 346) may be composed of copper or other suitable conductive material.

In one aspect of the disclosure, portions (e.g., 330a, 330b, 330c) of the conductive interconnect layer 330 are partially surrounded by a barrier liner 332 (e.g., 332a, 332b, 332c). For example, the barrier liner 332 may be disposed on sidewalls and a first surface of the conductive interconnect layer 330 that faces the active die 302. The barrier liner 332, however, is not on a second surface of the conductive interconnect layer 330 that faces the redistribution layer 340 and faces away from the active die 302. The barrier liner 332 may be provided by the foundry during the fabrication process of the conductive interconnect layer 330. While the barrier liner 332 may be formed during the fabrication of the HDFO package structure 300, the barrier liner 332 may be formed prior to the fabrication of the HDFO package structure 300. The barrier liner 332 may be composed of a barrier material such a tantalum or other suitable barrier material.

The redistribution layer 340 includes a first conductive routing layer 342 coupled to the second via 324. In this arrangement, a portion (e.g., 332d) of the barrier liner 332 is disposed on sidewalls of the second via 324 and a surface of the first conductive routing layer 342 facing the active die 302. The first conductive routing layer 326 is formed using, for example, a second BEOL interconnect layer (e.g., metal two (M2)). A second conductive routing layer 346 is coupled to the first conductive routing layer 326 through a third via 344 (e.g., a second BEOL via (V2)). The second conductive routing layer 346 is formed using, for example, a third BEOL conductive interconnect layer (e.g., metal three (M3)). The second conductive routing layer 346 is also coupled to the first conductive interconnect 350 through, for example, an under fill interconnect layer 348. The first conductive interconnect 350 may couple to a system board, a package substrate or other suitable carrier substrate (not shown). The first conductive interconnect 350 may be configured according to a ball grid array (BGA) interconnect structure.

FIGS. 4A-4M illustrate an HDFO package structure 400 at various stages of fabrication according to aspects of the present disclosure. For example, FIGS. 4A-4L illustrate a sequential fabrication approach of the HDFO package structure 400 shown in FIG. 4M.

Figure 4A:
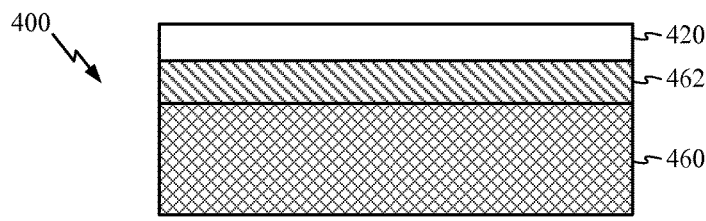
FIGS. 4A-4M illustrate a high density fan out package structure at various stages of fabrication according to one aspect of the present disclosure.

Beginning with FIG. 4A, a carrier substrate (e.g., a semiconductor wafer) 460 is provided. The carrier substrate 460 may be, for example, a silicon-based substrate, a glass-based substrate or other materials such as those implemented with bulk substrates for semiconductor wafers. An insulating layer 462 may be deposited on an active surface of the carrier substrate 460. The insulating layer 462 may be an oxide or other suitable insulator material. A first dielectric layer of a contact layer 420 may be deposited on the insulating layer 462. The contact layer 420 may be a passivation layer including an oxide, a nitride or other like insulator material and may insulate signals as well as protect the various circuits and the conductive elements.

Figure 4B:
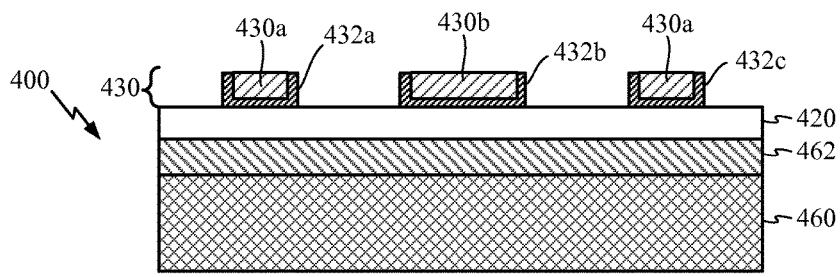

In FIG. 4B, a conductive interconnect layer 430 for routing signals between a redistribution layer 440 and an active die 402 is formed by depositing a conductive material (e.g., copper) on a first dielectric layer of the contact layer 420. The conductive interconnect layer 430 may include conductive portions 430a and 430b. The conductive portions 430a and 430b may be formed using a first BEOL interconnect layer (e.g., M1). In this arrangement, the conductive portions 430a and 430b are partially surrounded by a barrier liner 432 (e.g., 432a, 432b, 432c). The barrier liner 432 is disposed on sidewalls and a first surface of the conductive portions 430a and 430b that faces the carrier substrate 460.

The barrier liner 432, however, is not disposed on a second surface of the conductive portions 430a and 430b that faces away from the carrier substrate 460. The barrier liner 432 (e.g., tantalum) is provided by the foundry during the fabrication process of the conductive interconnect layer 430.

Figure 4C:
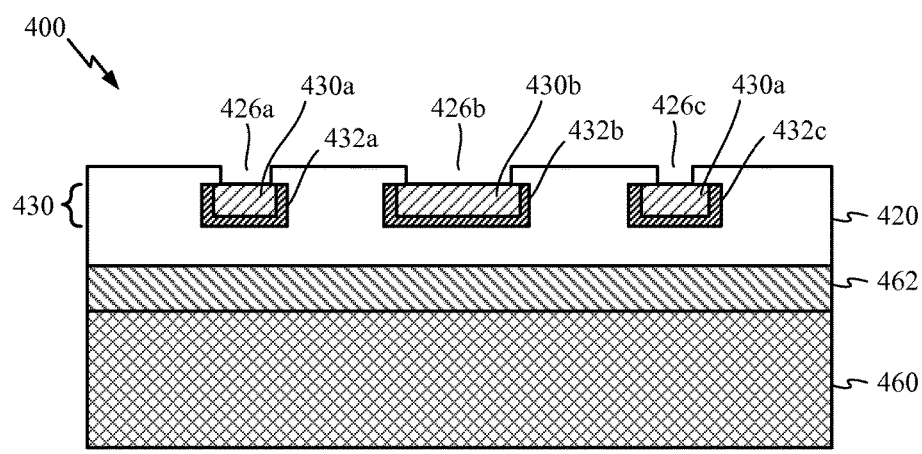

In FIG. 4C, additional dielectric layers of the contact layer 420 are deposited. The dielectric layers of the contact layer 420 may be composed of a nitride layer (e.g., silicon nitride (SiN)). One or more openings 426a, 426b, 426c within the dielectric material of the contact layer 420 are formed to expose the second surface of the conductive portions 430a and 430b that is not covered by the barrier liner 432. For example, the exposed portion of the conductive portions 430a and 430b may define a contact area for coupling to conductive routing layers of a redistribution layer.

In FIGS. 4D-4I, a first conductive routing layer 442 of a redistribution layer (e.g., 440 illustrated in FIGS. 4L and 4M) is formed on the contact layer 420. The redistribution layer may be a backside redistribution layer (BRDL) that is formed on a full thickness wafer (e.g., the carrier substrate 460). According to one aspect of the disclosure, the redistribution layer is formed before attaching one or more active die to the HDFO package structure 400. The redistribution layer may be formed on a dielectric layer of the contact layer 420. Forming the redistribution layer includes forming conductive routing layers and interconnecting the conductive routing layers by way of vias or other interconnections (e.g., conductive pads, conductive traces, etc.)

Figure 4D:
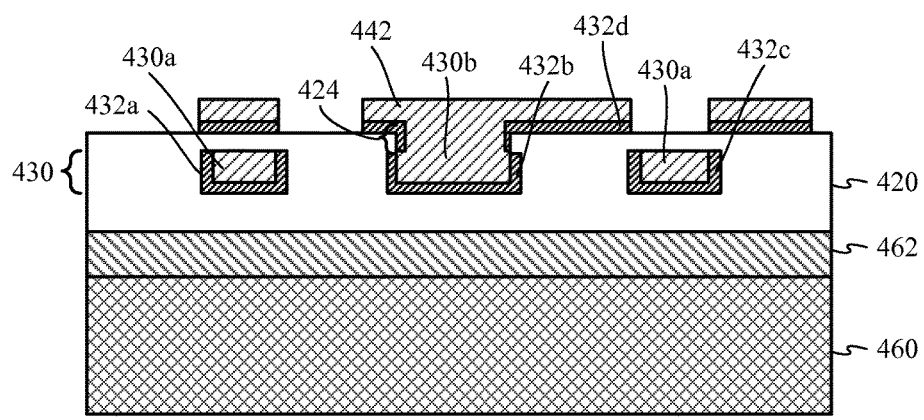

In FIG. 4D, a first conductive routing layer 442 is formed on the contact layer 420. The first conductive routing layer 442 may be formed using the second BEOL interconnect (e.g., M2). Forming the first conductive routing layer 442 includes formation of a contact to the conductive interconnect layer 430. For example, a second via 424 may be formed by depositing a conductive material in one of the openings 426b and on the second surface of one of the conductive portions 430b. The second via 424 may be formed using the first BEOL via (V1). The second via 424 is formed by depositing a conductive material in the opening 450b within the contact layer 420, rather than using a process for forming a complex through silicon via. The first conductive routing layer 442 is formed on the second via 424 and on the barrier liner 432d on the surface of the contact layer 420.

Figure 4E:
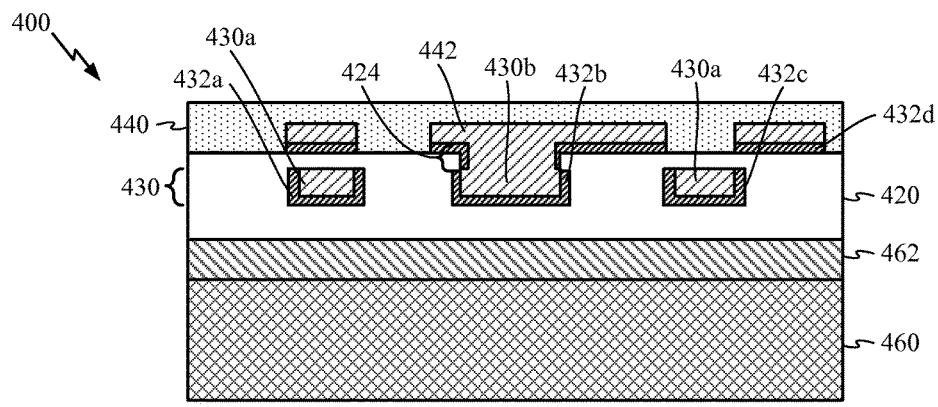

In FIG. 4E, a first material layer (e.g., a polymer dielectric material) of a redistribution layer 440 is deposited on the contact layer 420 and on each of the portions of the first conductive routing layer 442. For example, a first layer polymer dielectric is deposited on the portions of the first conductive routing layer 442.

Figure 4F:
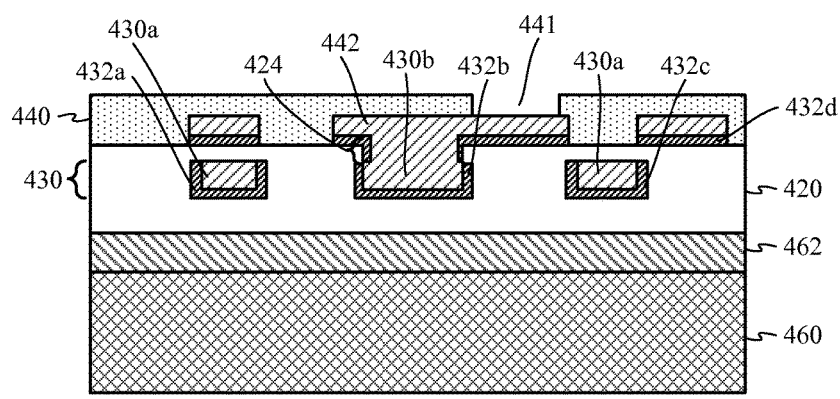

In FIG. 4F, an opening is formed within the first material layer of the redistribution layer 440 to expose a surface of the first conductive routing layer 442. In this example, the first material layer of the redistribution layer 440 includes an opening 441 that exposes a contact area of the first conductive routing layer 442. The contact area of the first conductive routing layer 442 faces away from the carrier substrate 460.

Figure 4G:
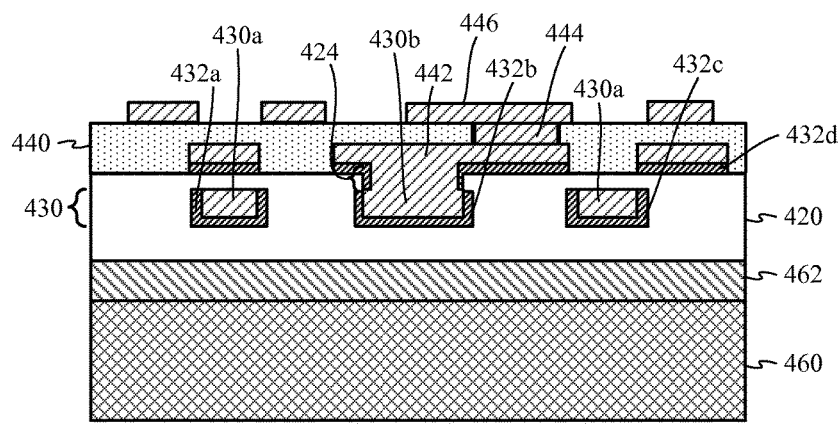

In FIG. 4G, a second conductive routing layer 446 of the redistribution layer 440 is formed on the first material layer of the redistribution layer 440. The second conductive routing layer 446 may be formed using the second BEOL interconnect (e.g., M2) that includes conductive portions. Forming the second conductive routing layer 446 includes forming redistribution conductive portions on the first material layer of the redistribution layer 440. For example, a contact area of the second conductive routing layer 446 is coupled to a contact area of the first conductive routing layer 442 through a third via 444. The third via 444 is formed in the opening 441 within the first material layer of the redistribution layer 440. The third via 444 may be formed as the second BEOL via (e.g., V2).

Figure 4H:
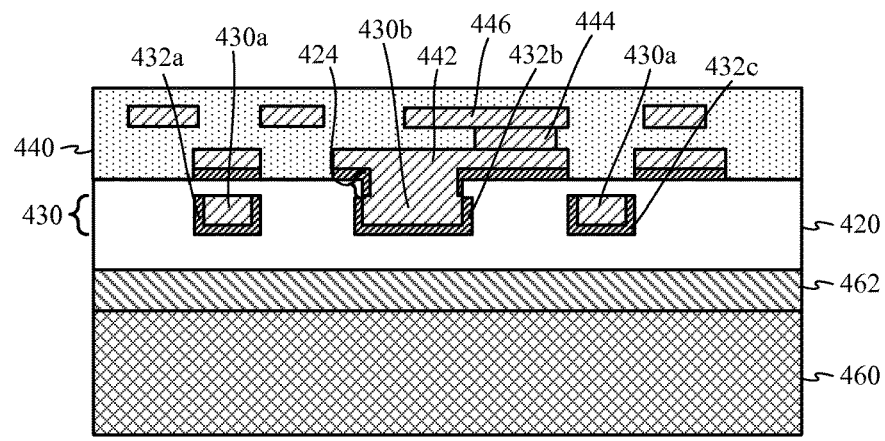

In FIG. 4H, a second material layer of the redistribution layer 440 is deposited on the first material layer of the redistribution layer 440. The second material layer of the redistribution layer 440 is deposited on each of the portions of the second conductive routing layer 446. For example, a second layer of polymer dielectric material is deposited on each conductive portion of the second conductive routing layer 446 and on the first layer of polymer dielectric material of the redistribution layer 440.

Figure 4I:
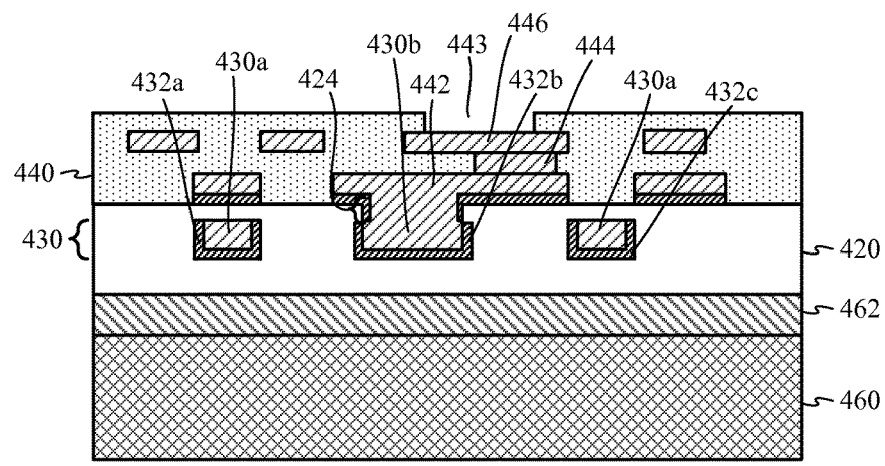

In FIG. 4I, an opening 443 is formed within the second material layer of the redistribution layer 440 to expose a surface of the second conductive routing layer 446. In this example, the opening 443 exposes a contact area of the second conductive routing layer 446. The exposed contact area of the second conductive routing layer 446 may be prepared for connecting to external devices. In one aspect of the disclosure, the contact area of the second conductive routing layer 446 may be configured according to a ball grid array (BGA) interconnect structure. For example, the contact area of the second conductive routing layer 446 may be configured to receive an under fill interconnect layer for connecting the ball grid array (BGA) interconnect structure to an external device.

Figure 4J:
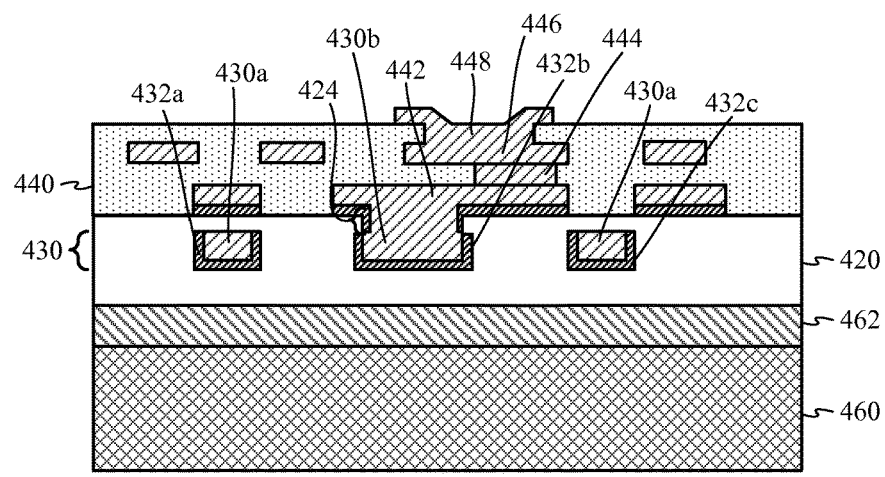

In FIG. 4J, a conductive material may be deposited in the opening 443 to enable connection of the HDFO package structure 400 to external devices. In this arrangement, an under fill interconnect layer 448 (e.g., an under bump metallization (UBM) layer, seed layer, etc.) is deposited in the opening 443 and on the contact area 470b of the second conductive routing layer 446. The under fill interconnect layer 448 may be configured to receive a first conductive interconnect (e.g., 450 of FIG. 4M) for connecting to an external device.

Figure 4K:
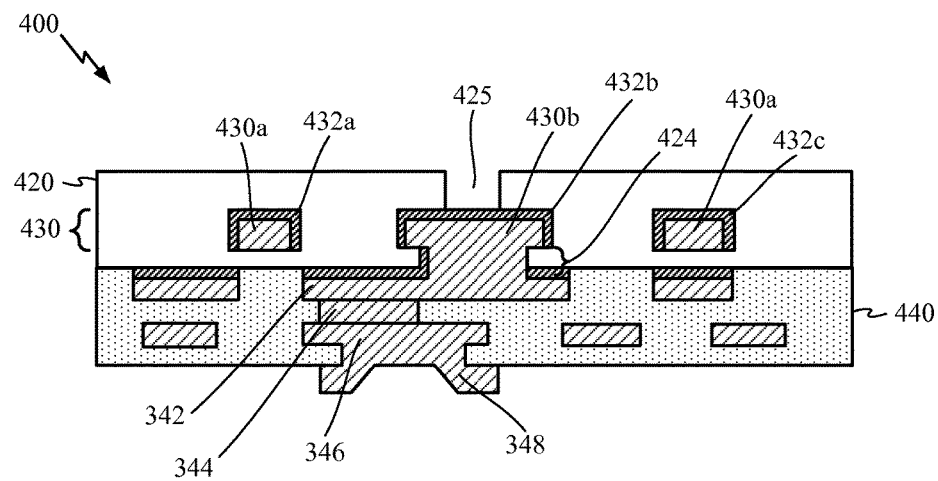

In FIG. 4K, the HDFO package structure 400 may be thinned to a desired thickness by removing the carrier substrate 460. For example, the carrier substrate 460 and other layers (e.g., insulating layer 462 and/or a portion of the dielectric layers of the contact layer 420) may be removed. The layers may be removed by a planarizing process or other processes (e.g., grinding, polishing or etching). The removal of the carrier substrate 460 and the insulating layer 462 exposes a surface of the contact layer 420. An opening 425 is formed within a dielectric layer of the contact layer 420 to expose the barrier liner portion 432b on one of the conductive portions 430b of the conductive interconnect layer 430. The opening 445 exposes a contact area of the barrier liner portion 432b of the barrier liner 432 that faces away from the redistribution layer 440. This exposed contact area may be configured to mate with an interconnect for coupling an active die to the HDFO package structure 400.

Figure 4L:
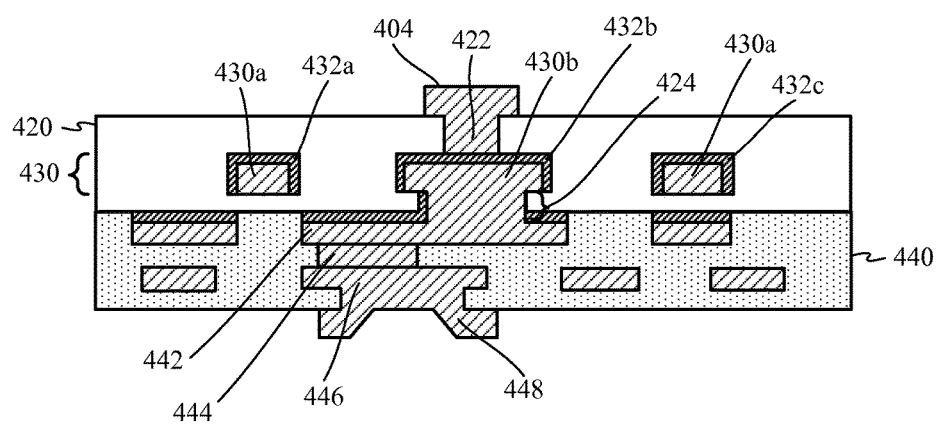

In FIG. 4L, a first via 422 is formed by depositing a conductive material (e.g., copper) in the opening 425. A first conductive portion 404 (e.g., a conductive trace or contact pad) of a second conductive interconnect (e.g., second conductive interconnect 410 of FIG. 4M) is formed on the first via 422 and on the contact layer 420. The first via 422 and the first conductive portion 404 may be formed by a dual damascene process. The first via 422 and the first conductive portion 304 may be an under fill interconnect layer (e.g., a UBM layer). The first conductive portion 404 may be configured to couple with a conductive pillar or other like interconnect for coupling an active die to the HDFO package structure 400, as shown in FIG. 4M.

Figure 4M:
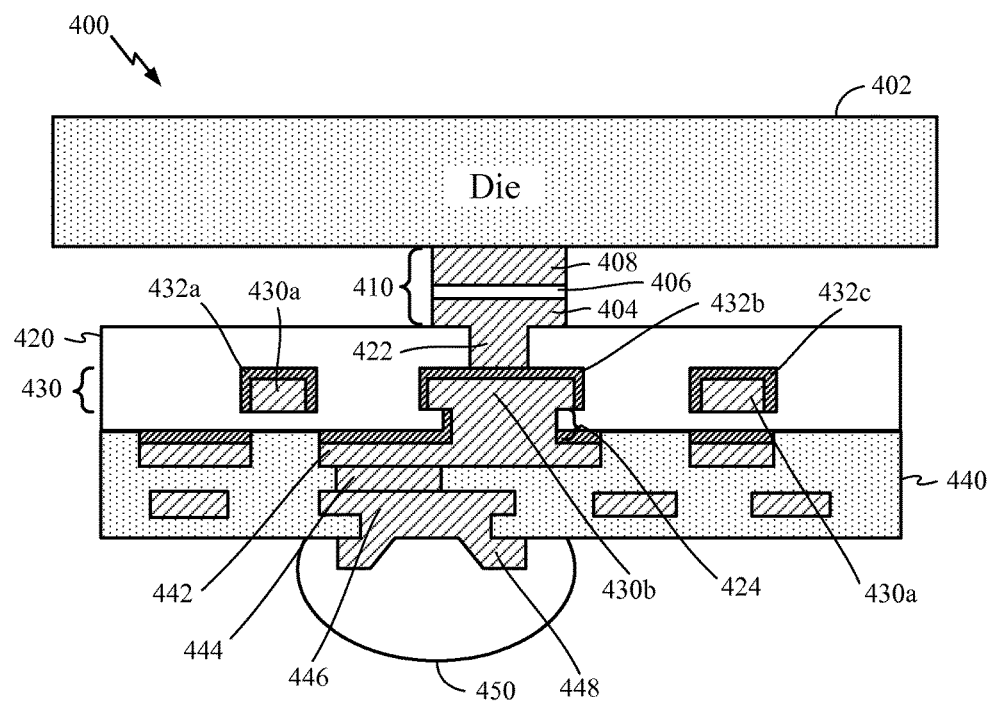

In FIG. 4M, an active die 402 is coupled to the HDFO package structure 400 via a second conductive interconnect 410 (e.g., front-side). In one aspect of the present disclosure, the second conductive interconnect 410 has a pillar shape and includes a first conductive portion 304 (e.g., a conductive trace or contact pad), a second conductive portion 306 (e.g., a solder material) and a third conductive portion 308 (e.g., a conductive pillar of the active die 302). In this arrangement, the combination of the first conductive portion 404, the second conductive portion 406 and the third conductive portion 408 form a conductive pillar interconnect between the active die 402 and the HDFO package structure 400.

FIGS. 5A-5F illustrate another HDFO package structure 500 at various stages of fabrication according to aspects of the present disclosure. Similar to FIGS. 4A-4M, FIGS. 5A-5F illustrate a sequential process for fabrication of the HDFO package structure 500.

Figure 5A:
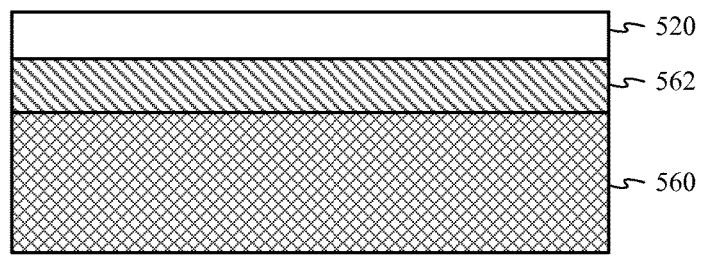
FIGS. 5A-5F illustrate a high density fan out package structure at various stages of fabrication according to one aspect of the present disclosure.

Beginning with FIG. 5A, a first carrier substrate (e.g., a semiconductor wafer) 560 is provided. An insulating layer 562 may be deposited on a surface 544 of the first carrier substrate 560. A first dielectric layer of a contact layer 520 may be deposited on the insulating layer 562. The first dielectric layer of the contact layer 520 may be a passivation layer including an oxide, a nitride or other like insulator material and may insulate signals as well as protect the various circuits and the conductive elements.

Figure 5B:
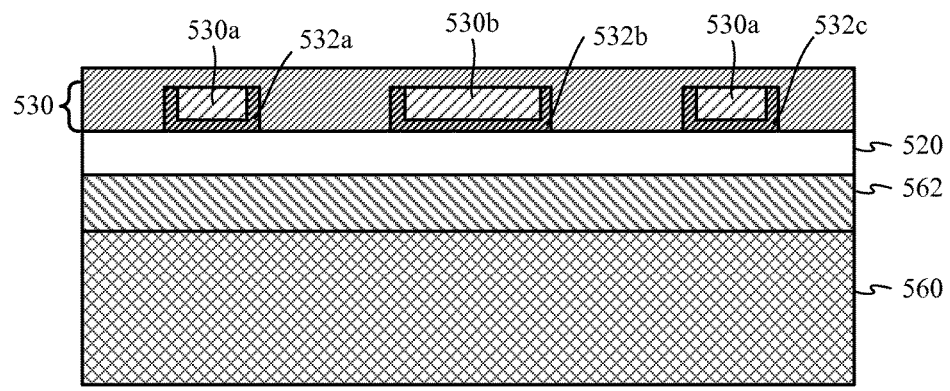
Figure 5C:
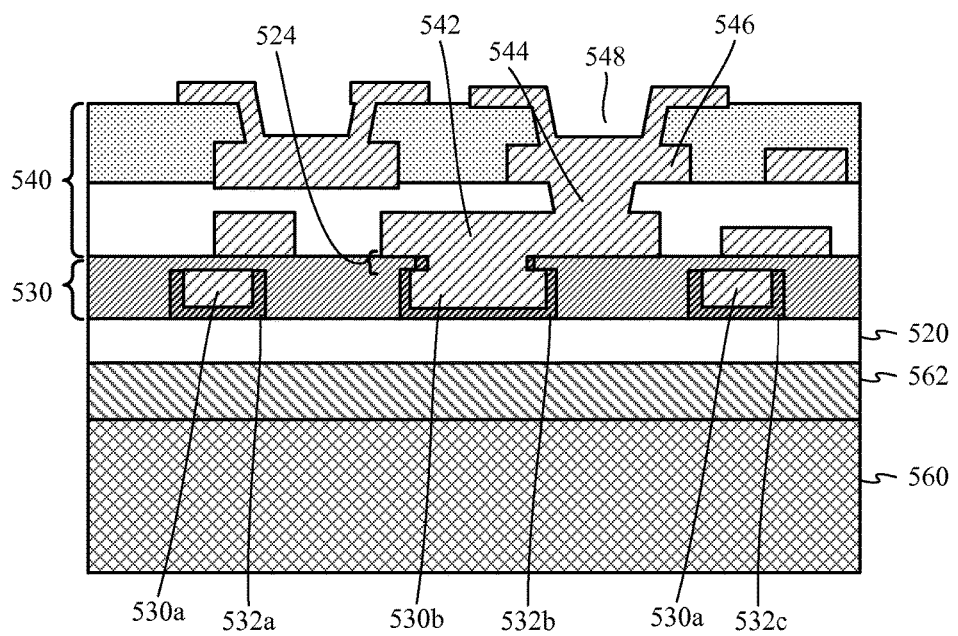

In FIG. 5B, a conductive interconnect layer 530 for routing signals between a redistribution layer and an active die is deposited on the first dielectric layer of the contact layer 520. For example, the conductive interconnect layer 530 may be a first BEOL interconnect layer (e.g., M1) that includes conductive portions. A second dielectric layer of the contact layer 520 is deposited on the first dielectric layer and on the conductive interconnect layer 530. Similar to the conductive portions 430a and 430b, the conductive portions 530a and 530b may be partially surrounded by a barrier liner 532 (532a, 532b, 532c). The barrier liner 532 (e.g., from the foundry) may be tantalum or other suitable barrier materials.

Similar to FIG. 4D-4I, FIG. 5C illustrates a redistribution layer 540 formed on the contact layer 520 and coupled to a conductive portion 530b of the conductive interconnect layer 530. As noted, the redistribution layer 540 is formed before attaching one or more active die to the HDFO package structure 500. Forming the redistribution layer 540 includes forming conductive routing layers (e.g., 542, 546) and interconnecting the conductive routing layers (e.g., 542, 546) by way of vias (e.g., 524, 544) or other like interconnections.

For example, a first conductive routing layer 542 (e.g., M2) is formed on the contact layer 520 and coupled to the conductive portion 530b of the conductive interconnect layer 530 using a second via 524 (e.g., V1). A second conductive routing layer 546 (e.g., M3) is formed on a first polymer dielectric layer and coupled to the first conductive routing layer 526 using a third via 524 (e.g., V2).

A contact area of the second conductive routing layer 546 may be coupled to a conductive interconnect for connecting the HDFO package structure 500 to one or more external devices. In one aspect of the disclosure, the contact area of the second conductive routing layer 546 may be configured according to a ball grid array (BGA) interconnect structure. For example, the contact area of the second conductive routing layer 546 may be configured to receive a solder interconnect for connecting the ball grid array (BGA) interconnect structure to the one or more external devices. In one aspect of the disclosure, an under fill interconnect layer 548, (e.g., a backside UBM layer) is deposited on the contact area of the second conductive routing layer 546. For example, the under fill interconnect layer 548 may be deposited on the contact area of the second conductive routing layer 546.

Figure 5D:
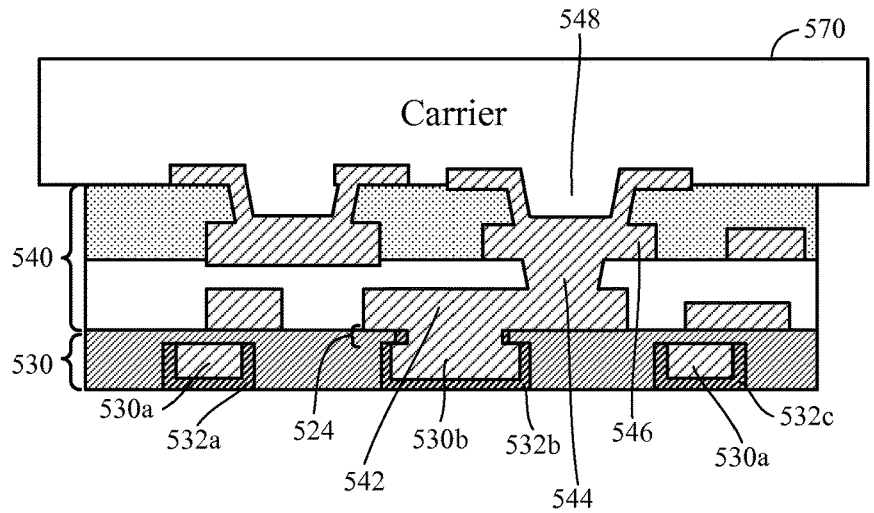

In some aspects of the disclosure, a second carrier substrate 570 may be attached to the HDFO package structure 500 (as shown in FIG. 5D) to perform the remaining processes.

In FIG. 5D, layers of the HDFO package structure 500 are removed to bring the HDFO package structure 500 to a desired thickness. The layers of the HDFO package structure 500 are removed with the support of the second carrier substrate 570. As noted, the second carrier substrate 570 provides support for the HDFO package structure 500 while removing the layers. The second carrier substrate 570 may be attached to exposed surfaces of the HDFO package structure 500 opposite the first carrier substrate 560 that was removed. For example, the second carrier substrate 570 may be configured to provide structural rigidity or a base for removal of the first carrier substrate 560 and other layers (e.g., insulating layer 562 and a dielectric layer of the contact layer 520). The layers may be removed by a planarizing process or other like processes (e.g., grinding, polishing or etching).

Figure 5E:
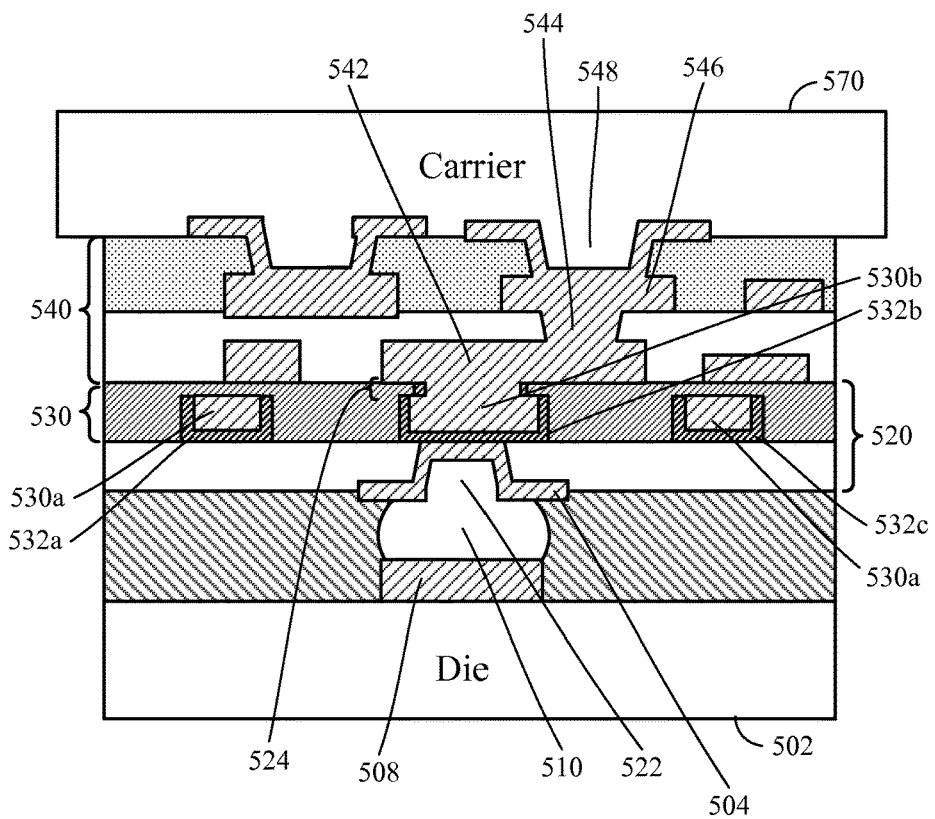

Alternatively, removal of the layers may include removal of the first carrier substrate 560 and the insulating layer 562 to expose the surface of the contact layer 520 as shown in FIG. 5E.

In FIG. 5E, an active die 502 is coupled to the HDFO package structure 500 by one or more interconnects. In this arrangement, a first via 522 (e.g., V0) is formed within the contact layer 520. The first via 522 may be lined with a seed layer or an under fill interconnect layer 504. The first via 522 is aligned to a second conductive interconnect 510 for coupling the active die to the HDFO package structure 500. For example, a solder material may be deposited on the under fill interconnect layer 504 to couple with a contact pad 508 for coupling the active die 502 to the HDFO package structure 500.

Figure 5F:
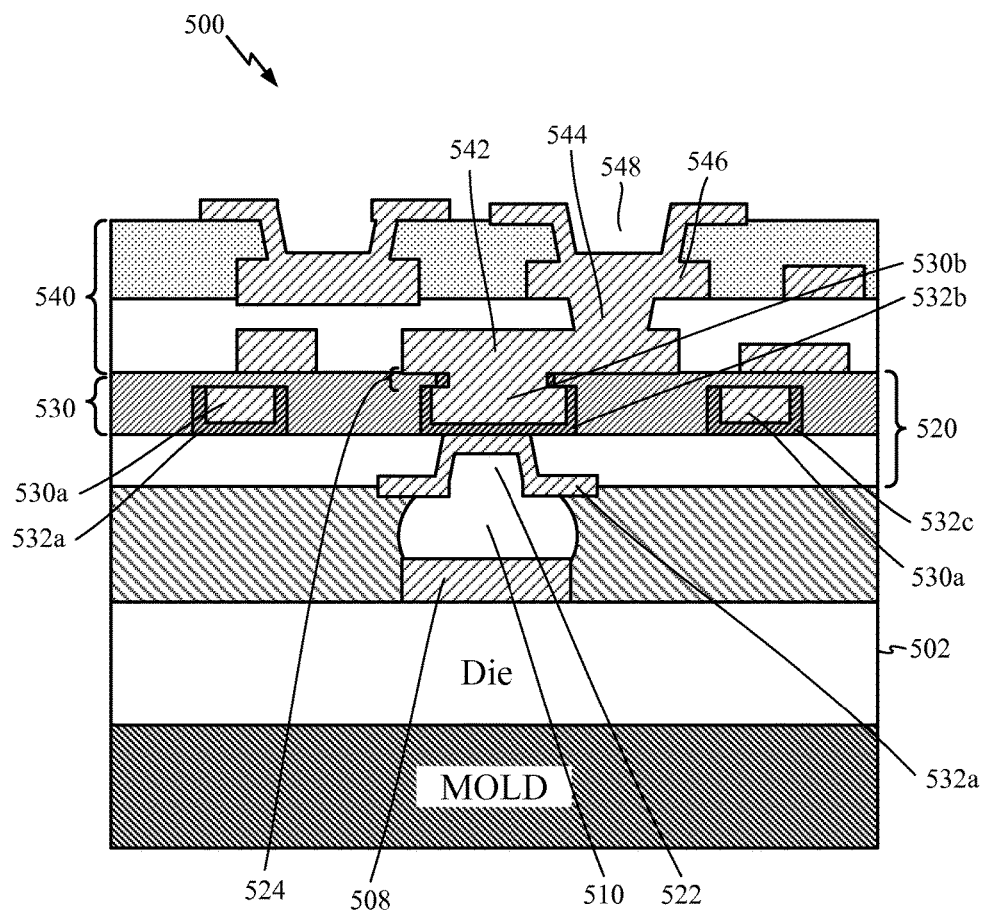

In FIG. 5F, a mold material 580 is coupled to a surface of the active die 502 opposite the redistribution layer 540. It should be recognized that an HDFO package structure, according to aspects of the present disclosure, is not limited to the number of layers shown in FIGS. 4A-4M and 5A to 5F.

Figure 6:
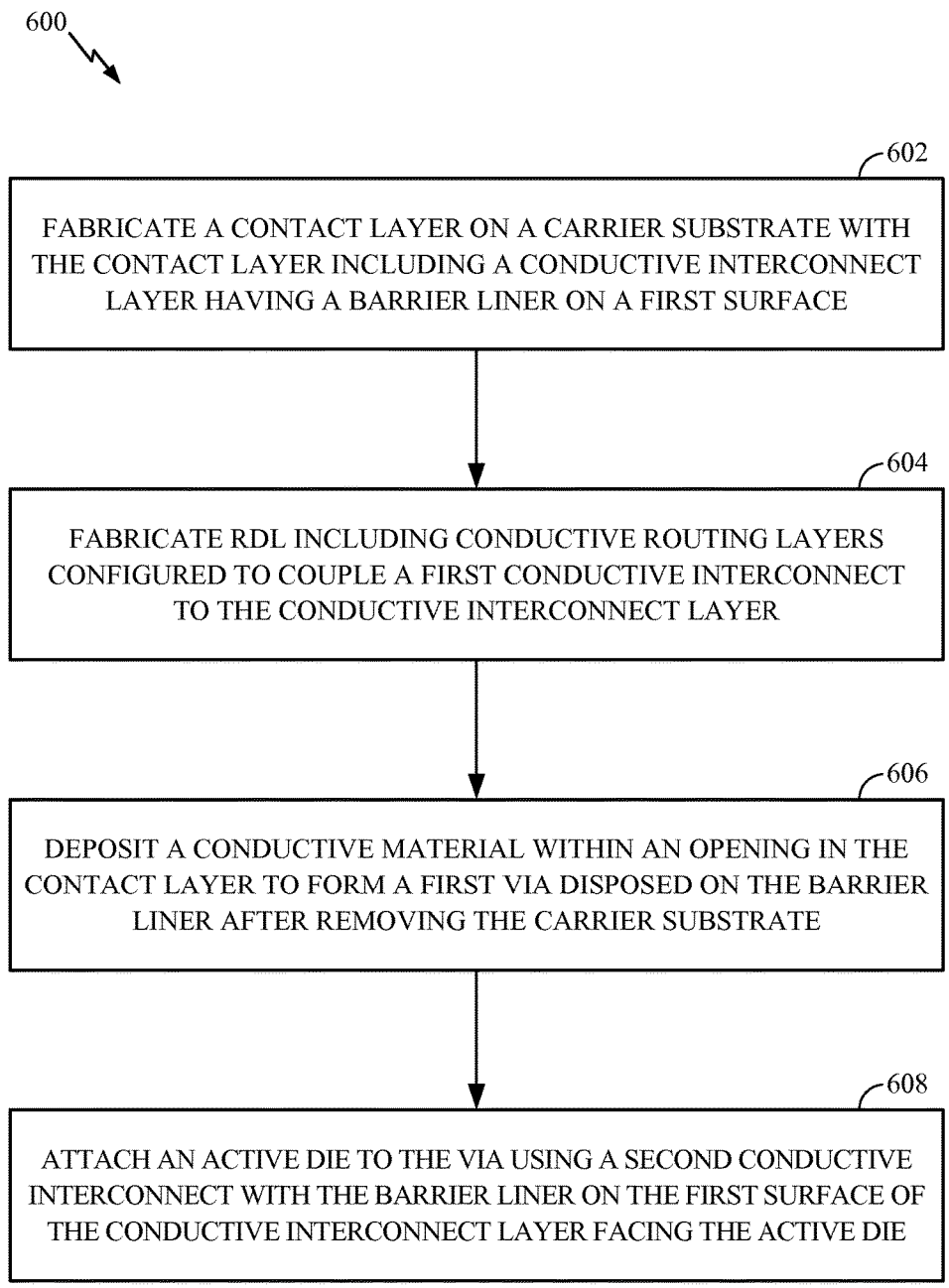
FIG. 6 is a process flow diagram illustrating a method for fabricating a high density fan out package structure according to an aspect of the present disclosure.

FIG. 6 is a flow diagram illustrating a method 600 for fabricating a high density fan out (HDFO) package structure according to one aspect of the disclosure. At block 602, a contact layer is fabricated on a carrier substrate. The contact layer include a conductive interconnect layer having a barrier liner on a first surface, for example, as shown in FIGS. 3 and 4M. At block 604, a redistribution layer (RDL) is fabricated. The RDL includes conductive routing layers configured to couple a first conductive interconnect to the conductive interconnect layer. At block 606, a conductive material is deposited within an opening in the contact layer to form a first via on the barrier liner after removing the carrier substrate. For example, as shown in FIGS. 4K and 4L, the first via 422 is formed after removing the carrier substrate 460. In block 608, an active die is attached to the via using a second conductive interconnect. In this arrangement, the barrier liner 432 on the first surface of the conductive interconnect layer 430 faces the active die 402, for example, as shown in FIG. 4M.

In one configuration, a high density fan out package (HDFO) package structure includes means for coupling a first conductive interconnect to a conductive interconnect layer. In this configuration, a second surface of the conductive interconnect layer faces the coupling means and a first surface of the conductive interconnect layer faces an active die. In one aspect of the disclosure, the coupling means is the redistribution layer 440/550 of FIGS. 4M and 5F, configured to perform the functions recited by the coupling means. In another aspect, the aforementioned means may be a device or any layer configured to perform the functions recited by the aforementioned means.

A HDFO package structure, according to aspects of the present disclosure, includes multiple active die or a single chip structure. The HDFO package structure may be fabricated according to a chip last attach process. The chip last attach process includes attaching an active die to the HDFO package structure after a redistribution layer is formed. For example, the redistribution layer may be verified through testing before the active die is attached to avoid attachment to a defective redistribution layer.

In one aspect of the disclosure, the HDFO package structure includes a contact layer that includes a conductive interconnect layer. The conductive interconnect layer may include a first surface facing an active die and a second surface facing a redistribution layer. A first conductive interconnect (e.g., ball grid array (BGA)) may couple the HDFO package structure to an external device. A conductive liner may be disposed on the first surface of the conductive interconnect layer. The conductive liner may be a barrier or seed liner of tantalum. The barrier liner may provide protection for the conductive interconnect layer during the formation (e.g., electroplating) of the interconnects to the active die.

A redistribution layer (RDL) is coupled to the conductive interconnect layer of the contact layer. The redistribution layer may be a fan out routing layer. The redistribution layer includes conductive routing layers configured to couple a first conductive interconnect to the conductive interconnect layer. As noted, the redistribution layer is formed before attaching the active die to avoid damaging the active die during formation of the redistribution layer. The redistribution layer can be a backside redistribution layer (BRDL) that is formed on a full thickness wafer. Implementing the HDFO package structure on the backside redistribution layer improves yield of the active die and reduces warpage of the HDFO package structure.

A via may be coupled to the barrier liner to interconnect the second conductive interconnect of the active die. The conductive material may include one or more conductive interconnects. For example, the second conductive material may include an under bump conductive interconnect, a solder material and/or a conductive pillar. The under bump conductive interconnect may be disposed in an opening within the conductive layer that exposes a surface of the barrier liner. The conductive pillar may be coupled to a contact pad of the die. The solder material be between the under bump conductive interconnect and the conductive pillar. The under bump conductive interconnect and the conductive pillar may be copper.

Figure 7:
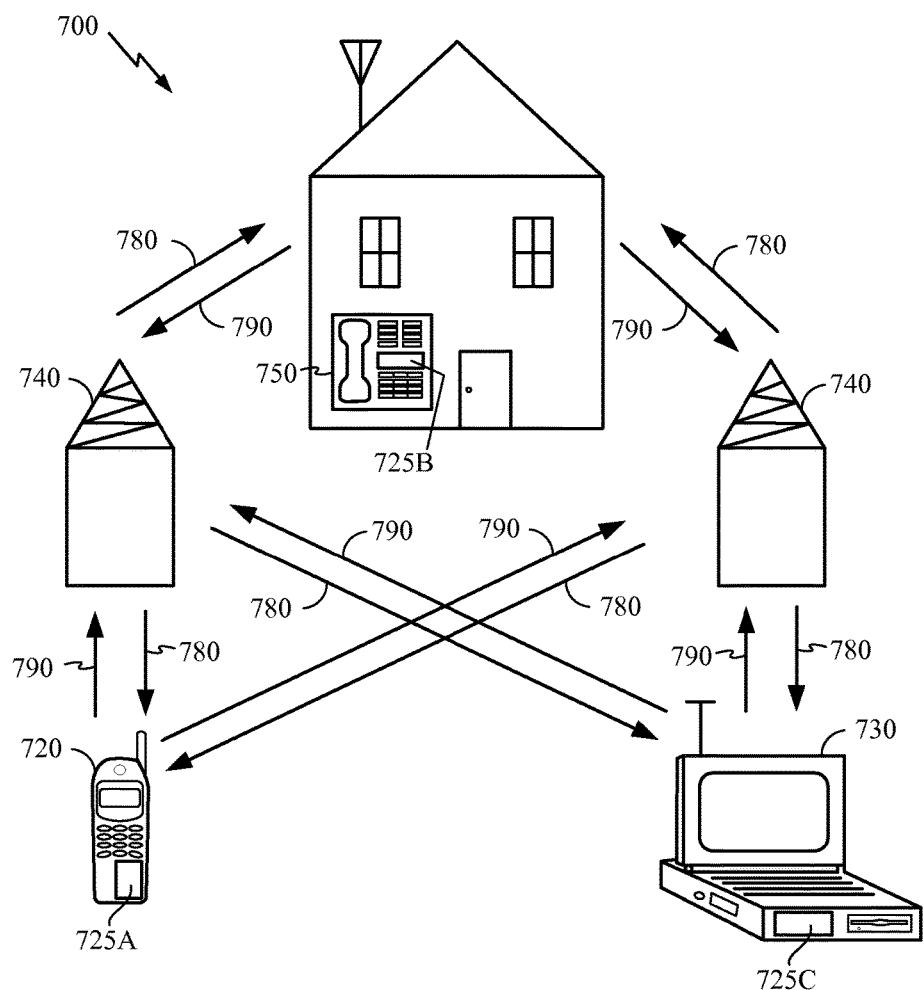
FIG. 7 is a block diagram showing an exemplary wireless communication system in which a configuration of the disclosure may be advantageously employed.

FIG. 7 is a block diagram showing an exemplary wireless communication system 700 in which an aspect of the disclosure may be advantageously employed. For purposes of illustration, FIG. 7 shows three remote units 720, 730, and 750 and two base stations 740. It will be recognized that wireless communication systems may have many more remote units and base stations. Remote units 720, 730, and 750 include IC devices 725A, 725C, and 725B that include the disclosed HDFO package structure. It will be recognized that other devices may also include the disclosed HDFO package structure, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units 720, 730, and 750 may be a mobile phone, a hand-held personal communication system (PCS) unit, a communications device, a portable data unit such as a personal digital assistant (PDA), a GPS enabled device, a navigation device, a set top box, a music player, a video player, an entertainment unit, a fixed location data unit such as a meter reading equipment, or other devices that store or retrieve data or computer instructions, or combinations thereof. Although FIG. 7 illustrates remote units according to the aspects of the disclosure, the disclosure is not limited to these exemplary illustrated units. Aspects of the disclosure may be suitably employed in many devices, which include the disclosed devices.

Figure 8:
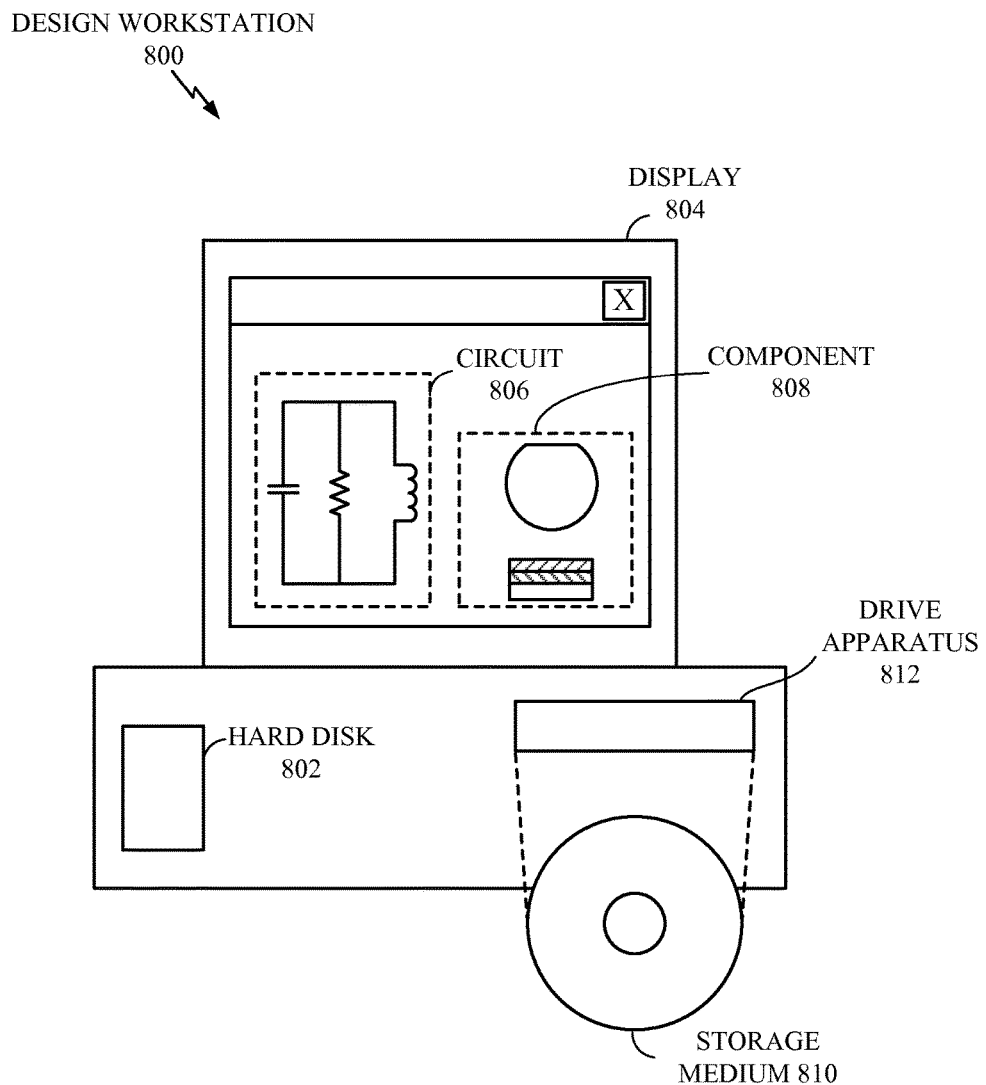
FIG. 8 is a block diagram illustrating a design workstation used for circuit, layout, and logic design of a semiconductor component according to one configuration.

FIG. 8 is a block diagram illustrating a design workstation used for circuit, layout, and logic design of a semiconductor component, such as the devices disclosed above. A design workstation 800 includes a hard disk 802 containing operating system software, support files, and design software such as Cadence or OrCAD. The design workstation 800 also includes a display 804 to facilitate design of a circuit 806 or a semiconductor component 808 such as a HDFO package structure. A storage medium 810 is provided for tangibly storing the design of the circuit 806 or the semiconductor component 808. The design of the circuit 806 or the semiconductor component 808 may be stored on the storage medium 810 in a file format such as GDSII or GERBER. The storage medium 810 may be a CD-ROM, DVD, hard disk, flash memory, or other appropriate device. Furthermore, the design workstation 800 includes a drive apparatus 812 for accepting input from or writing output to the storage medium 810.

Data recorded on the storage medium 810 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 810 facilitates the design of the circuit 806 or the semiconductor component 808 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A fan out package structure, comprising:
a contact layer including a conductive interconnect layer, the conductive interconnect layer comprising a plurality of conductive portions, each of the plurality of conductive portions having a first surface facing an active die, a second surface facing a redistribution layer, and at least one sidewall;
the conductive interconnect layer including a first barrier liner on the at least one sidewall and the first surface of each of the plurality of conductive portions of the conductive interconnect layer, the first barrier liner directly contacting each of the plurality of conductive portions of the conductive interconnect layer and the first barrier liner having surfaces flush with the second surface of each of the conductive portions of the conductive interconnect layer;
the redistribution layer comprising a plurality of conductive routing layers configured to couple a first conductive interconnect to the conductive interconnect layer, a first of the plurality of conductive routing layers including a plurality of conductive sections, each conductive section having a first surface facing the active die, a second barrier liner on the first surface of each of the conductive sections, the second barrier liner in direct contact with the contact layer; and
a first via coupled to the first barrier liner, the first via configured to couple the first barrier liner to the active die through a second conductive interconnect.

2. The fan out package structure of claim 1, in which the first conductive interconnect is a ball grid array (BGA).

3. The fan out package structure of claim 1, in which the first and second barrier liners comprise tantalum.

4. The fan out package structure of claim 1, in which the first via comprises an under bump conductive layer on the first barrier liner and a conductive material on the under bump conductive layer and coupled to the second conductive interconnect.

5. The fan out package structure of claim 1, in which the conductive interconnect layer comprises a first back-end-of-line (BEOL) conductive interconnect layer (M1).

6. The fan out package structure of claim 1, in which the second conductive interconnect comprises a conductive pillar or a conductive bump.

7. The fan out package structure of claim 1, in which the second conductive interconnect is coupled to a contact pad of the active die.

8. The fan out package structure of claim 1, in which at least one of the plurality of conductive portions of the conductive interconnect layer is coupled to one of the plurality of conductive routing layers of the redistribution layer through a second via or a conductive trace on the conductive routing layer.

9. The fan out package structure of claim 8, in which the first via comprises a middle-of-line zero via (V0) and the second via comprises a back-end-of-line (BEOL) first via (V1).

10. The fan out package structure of claim 1, incorporated into at least one of a music player, a video player, an entertainment unit, a navigation device, a communications device, a personal digital assistant (PDA), a fixed location data unit, and a computer.

11. The fan out package structure of claim 1, in which the second barrier liner comprises a first portion orthogonal to a second portion.

12. A fan out package structure, comprising:
a contact layer including a conductive interconnect layer, the conductive interconnect layer comprising a plurality of conductive portions, each of the plurality of conductive portions having a first surface facing an active die, a second surface opposite the first surface, and at least one sidewall;
the conductive interconnect layer including a first barrier liner on the at least one sidewall and the first surface of each of the plurality of conductive portions of the conductive interconnect layer, the first barrier liner directly contacting each of the plurality of conductive portions of the conductive interconnect layer and the first barrier liner having surfaces flush with the second surface of each of the conductive portions of the conductive interconnect layer;
means for coupling a first conductive interconnect to the conductive interconnect layer in which the second surface of the conductive interconnect layer faces the coupling means, the coupling means including a plurality of conductive sections, each conductive section having a first surface facing the active die, a second barrier liner on the first surface of each of the conductive sections, the second barrier liner in direct contact with the contact layer; and
a first via coupled to the first barrier liner, the first via configured to couple the first barrier liner to the active die through a second conductive interconnect.

13. The fan out package structure of claim 12, in which the first conductive interconnect is a ball grid array (BGA).

14. The fan out package structure of claim 12, in which the first and second barrier liners comprise tantalum.

15. The fan out package structure of claim 12, in which the first via comprises an under bump conductive layer on the first barrier liner and a conductive material on the under bump conductive layer and coupled to the second conductive interconnect.

16. The fan out package structure of claim 12, incorporated into at least one of a music player, a video player, an entertainment unit, a navigation device, a communications device, a personal digital assistant (PDA), a fixed location data unit, and a computer.

17. The fan out package structure of claim 12, in which the second barrier liner comprises a first portion orthogonal to a second portion.

* * * * *